United States Patent
Kondo et al.

(10) Patent No.: US 12,162,794 B2
(45) Date of Patent: *Dec. 10, 2024

(54) GLASS SHEET WITH POROUS COATING FILM AND METHOD OF PRODUCING SAME

(71) Applicant: Nippon Sheet Glass Company, Limited, Tokyo (JP)

(72) Inventors: Fumiyoshi Kondo, Kyoto (JP); Takeshi Yabuta, Hyogo (JP); Toru Yamamoto, Hyogo (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 1044 days.

This patent is subject to a terminal disclaimer.

(21) Appl. No.: 17/011,818

(22) Filed: Sep. 3, 2020

(65) Prior Publication Data

US 2020/0399170 A1 Dec. 24, 2020

Related U.S. Application Data

(63) Continuation of application No. 15/555,878, filed as application No. PCT/JP2016/001106 on Mar. 1, 2016, now Pat. No. 10,800,700.

(30) Foreign Application Priority Data

Mar. 6, 2015 (JP) .................................. 2015-044860

(51) Int. Cl.
    *C03C 17/00* (2006.01)
    *B32B 17/06* (2006.01)
    (Continued)

(52) U.S. Cl.
    CPC ............ *C03C 17/006* (2013.01); *B32B 17/06* (2013.01); *B32B 17/10036* (2013.01);
    (Continued)

(58) Field of Classification Search
    None
    See application file for complete search history.

(56) References Cited

U.S. PATENT DOCUMENTS

| 5,605,609 A | 2/1997 | Ando et al. |
| 8,098,432 B2 | 1/2012 | Ishizawa et al. |

(Continued)

FOREIGN PATENT DOCUMENTS

| JP | 2006215542 A | 8/2006 |
| JP | 2009237551 A | 10/2009 |

(Continued)

OTHER PUBLICATIONS

Machine Translation for Morita (JP-2014214063) (Year: 2014).*

(Continued)

*Primary Examiner* — Michael Forrest
(74) *Attorney, Agent, or Firm* — HSML P.C.

(57) ABSTRACT

The coated glass sheet of the present invention includes: a glass sheet; and a coating film provided on at least one principal surface of the glass sheet and having a smooth surface. The coating film includes: isolated closed pores present within the coating film; and a matrix. The coating film is substantially free of open pores open at the surface of the coating film. For the coated glass sheet of the present invention, a transmittance gain is 2.5% or more, the transmittance gain being calculated by subtracting an average transmittance of the glass sheet as determined by applying light having wavelengths of 380 to 1100 nm to the glass sheet in the absence of the coating film on the surface of the glass sheet from an average transmittance of the coated glass sheet as determined by applying light having the wavelengths to the coated glass sheet from a side on which the coating film lies.

19 Claims, 5 Drawing Sheets

(51) Int. Cl.

| | | |
|---|---|---|
| *B32B 17/10* | (2006.01) | |
| *C03C 1/00* | (2006.01) | |
| *C03C 17/23* | (2006.01) | |
| *C03C 17/30* | (2006.01) | |
| *C03C 23/00* | (2006.01) | |
| *H01L 31/0216* | (2014.01) | |
| *H01L 31/048* | (2014.01) | |

(52) U.S. Cl.
CPC .. *B32B 17/10174* (2013.01); *B32B 17/10339* (2013.01); *B32B 17/10706* (2013.01); *B32B 17/10733* (2013.01); *B32B 17/10761* (2013.01); *B32B 17/1077* (2013.01); *B32B 17/10788* (2013.01); *C03C 1/008* (2013.01); *C03C 17/23* (2013.01); *C03C 17/30* (2013.01); *H01L 31/0216* (2013.01); *H01L 31/048* (2013.01); *B32B 2457/12* (2013.01); *C03C 23/0075* (2013.01); *C03C 2217/213* (2013.01); *C03C 2217/425* (2013.01); *C03C 2217/732* (2013.01); *C03C 2218/113* (2013.01); *C03C 2218/116* (2013.01); *C03C 2218/118* (2013.01); *Y02E 10/50* (2013.01)

(56) References Cited

U.S. PATENT DOCUMENTS

| | | |
|---|---|---|
| 2006/0154044 A1 | 7/2006 | Yamada et al. |
| 2009/0161219 A1 | 6/2009 | Ishizawa et al. |
| 2009/0220774 A1 | 9/2009 | Imai et al. |
| 2010/0027123 A1 | 2/2010 | Imai et al. |
| 2010/0101649 A1 | 4/2010 | Huignard et al. |
| 2010/0136319 A1 | 6/2010 | Imai et al. |
| 2012/0237676 A1 | 9/2012 | Kalyankar et al. |
| 2012/0244318 A1 | 9/2012 | Koyo et al. |
| 2013/0202895 A1 | 8/2013 | Arfsten et al. |
| 2013/0279007 A1* | 10/2013 | Kawai ............... G02B 1/115 359/586 |
| 2014/0120341 A1 | 5/2014 | Kharchenko et al. |
| 2015/0037507 A1 | 2/2015 | Bockmeyer et al. |
| 2015/0177425 A1 | 6/2015 | Kondo et al. |
| 2016/0025899 A1 | 1/2016 | Ishizeki et al. |
| 2018/0050956 A1 | 2/2018 | Kondo et al. |
| 2018/0292577 A1 | 10/2018 | Yabuta et al. |

FOREIGN PATENT DOCUMENTS

| | | |
|---|---|---|
| JP | 2010038948 A | 2/2010 |
| JP | 2010509175 | 3/2010 |
| JP | 4622472 B2 * | 2/2011 |
| JP | 2014032248 | 2/2014 |
| JP | 2014079920 | 5/2014 |
| JP | 2014214063 | 11/2014 |
| JP | 2015075707 A | 4/2015 |
| WO | 2008001675 A1 | 1/2008 |
| WO | 2014020836 A1 | 2/2014 |
| WO | 2014061605 | 4/2014 |
| WO | 2014175124 | 10/2014 |

OTHER PUBLICATIONS

Machine Translation for JP 4622472 (Year: 2011).*
International Search Report for PCT/JP2016/001106, dated Jun. 7, 2016, 5 pages including English translation.
Translation of JP 2014-214063, Morita et al., Nov. 17, 2014, p. 1-47 (Year: 2014).
Office Action issued for Indian Patent Application No. 201717031768, dated Sep. 12, 2019, 5 pages.
International Search Report issued for International Patent Application No. PCT/JP2016/004080, dated Dec. 13, 2016, 5 pages including English translation.

* cited by examiner

GLASS SHEET WITH POROUS COATING FILM AND METHOD OF PRODUCING SAME

TECHNICAL FIELD

The present invention relates to a coated glass sheet and a method for producing the same.

BACKGROUND ART

For the purpose of improving the function of a glass or ceramic substrate in its intended use, a functional coating film is formed on the surface of the substrate. For example, a low-reflection coating film is formed on the surface of a substrate to increase the amount of light to be transmitted through the substrate or prevent glare caused by reflection.

Glass sheets provided with a low-reflection coating film are used, for example, in vehicle panes, show-windows, and photoelectric conversion devices. In a thin-film solar cell, which is a type of photoelectric conversion device, an underlayer film, a transparent conductive film, a photoelectric conversion layer made of amorphous silicon or the like, and a back-side thin-film electrode are stacked in this order on one principal surface of a glass substrate, and a low-reflection coating film is formed on the other principal surface of the glass sheet opposite to the one principal surface. In a so-called crystalline solar cell, which is another type of photoelectric conversion device, a cover glass is disposed on the sunlight-incident side, and a low-reflection coating film is formed on the surface of the cover glass. In a glass sheet for use in a solar cell, a low-reflection coating film is formed on the sunlight-incident surface of the glass sheet as described above. This allows more sunlight to reach the photoelectric conversion layer or solar cell element, thus increasing the amount of electricity to be generated.

Most commonly used low-reflection coating films are dielectric films formed by a process such as vacuum deposition, sputtering, or chemical vapor deposition (CVD). In some cases, a fine particle-containing film containing fine particles such as fine silica particles is used as a low-reflection coating film. Such a fine particle-containing film is formed by applying a coating liquid containing fine particles onto a transparent substrate by a technique such as dipping, flow coating, or spraying.

For example, JP 2014-032248 A (Patent Literature 1) discloses a cover glass for photoelectric conversion devices, the cover glass including: a glass sheet having surface asperities; and an antireflective film formed on the glass sheet and containing fine particles and a binder, the fine silica particles being uniformly arranged in a single layer on peak portions of the surface asperities in such a manner that a filling factor falls within a predetermined range. The antireflective film of this cover glass can produce an increase of at least 2.37% in average light transmittance in the wavelength range of 380 to 1100 nm.

CITATION LIST

Patent Literature

Patent Literature 1; JP 2014-032248 A

SUMMARY OF INVENTION

Technical Problem

A "transmittance gain" is an important parameter for a coated glass sheet having a low-reflection coating film when the coated glass sheet is used in a photoelectric conversion device. The transmittance gain is defined as the increase in average transmittance of a glass sheet provided with the coating film relative to the glass sheet unprovided with the coating film. The higher the transmittance gain is, the greater the amount of light transmitted through the glass sheet is, and the higher the efficiency of the photoelectric conversion device becomes. However, the cover glass disclosed in Patent Literature 1 is still unsatisfactory in terms of increase in transmittance gain.

In some cases where a glass sheet with a low-reflection coating film is used in a photoelectric conversion device, a photoelectric conversion element is inserted between the glass sheet with the low-reflection coating film and another sheet-shaped material and is sealed using an interlayer made of thermoplastic resin to form a laminated glass structure. This laminated glass structure effectively protects the photoelectric conversion element from the external environment, thus improving the durability and weather resistance of the photoelectric conversion element.

In this laminated glass structure, the low-reflection coating film is disposed on an outer side, namely on the side not in contact with the interlayer. However, the thermoplastic resin used for forming the interlayer may accidentally adhere to the low-reflection coating film during the process of forming the laminated glass structure. For example, the cover glass disclosed in Patent Literature 1 has a region with a thermoplastic resin accidentally adhering thereto and a region with no thermoplastic resin adhering thereto, and can be evaluated as having appearance defect due to the difference in appearance between these regions. The adhering thermoplastic resin penetrates so deep into the layer of fine particles that the adhering thermoplastic resin is very difficult to remove even if an attempt is made to remove the resin. In consequence, the yield of the production process is unfortunately decreased because of the appearance defect.

In view of such circumstances, the present invention aims to obtain a coated glass sheet including a glass sheet and a coating film formed on a principal surface of the glass sheet, the coated glass sheet being adapted to allow easy removal of matter such as a thermoplastic resin which has accidentally adhered thereto and to exhibit superior light transmission properties.

Solution to Problem

The present invention provides a coated glass sheet including:
  a glass sheet; and
  a coating film provided on at least one principal surface of the glass sheet and having a smooth surface, wherein
  the coating film includes: isolated closed pores present within the coating film; and a matrix,
  the coating film is substantially free of open pores open at the surface of the coating film, and
  a transmittance gain is 2.5% or more, the transmittance gain being calculated by subtracting an average transmittance of the glass sheet as determined by applying light having wavelengths of 380 to 1100 nm to the glass sheet in the absence of the coating film on the surface of the glass sheet from an average transmittance of the coated glass sheet as determined by applying light having the wavelengths to the coated glass sheet.

Saying that "the coating film is substantially free of open pores open at the surface of the coating film" means that the number of open pores per unit area of the surface of the coating film is less than 5 pores/$\mu m^2$ and preferably less than 0.2 pores/$\mu m^2$.

The present invention also provides a coated glass sheet production method for producing the above coated glass sheet of the present invention, the method including:
(i) applying a coating liquid containing a matrix raw material and a pore forming agent onto one principal surface of a glass sheet to form a wet film on the one principal surface of the glass sheet;
(ii) drying the wet film; and
(iii) calcining the dried film.

Advantageous Effects of Invention

In the coated glass sheet of the present invention, the coating film has a smooth surface. Additionally, the coating film is substantially free of open pores open at the surface of the coating film. Thus, when matter such as a thermoplastic resin adheres to the surface of the coating film, the adhering matter can easily be removed from the surface of the coating film. Furthermore, the coated glass sheet of the present invention can exhibit a transmittance gain as high as 2.5% or more by virtue of the coating film having a porous structure including isolated closed pores therein. That is, the present invention can provide a coated glass sheet that allows easy removal of matter such as a thermoplastic resin which has accidentally adhered thereto and that can exhibit superior light transmission properties.

DESCRIPTION OF EMBODIMENTS

Figure 1:
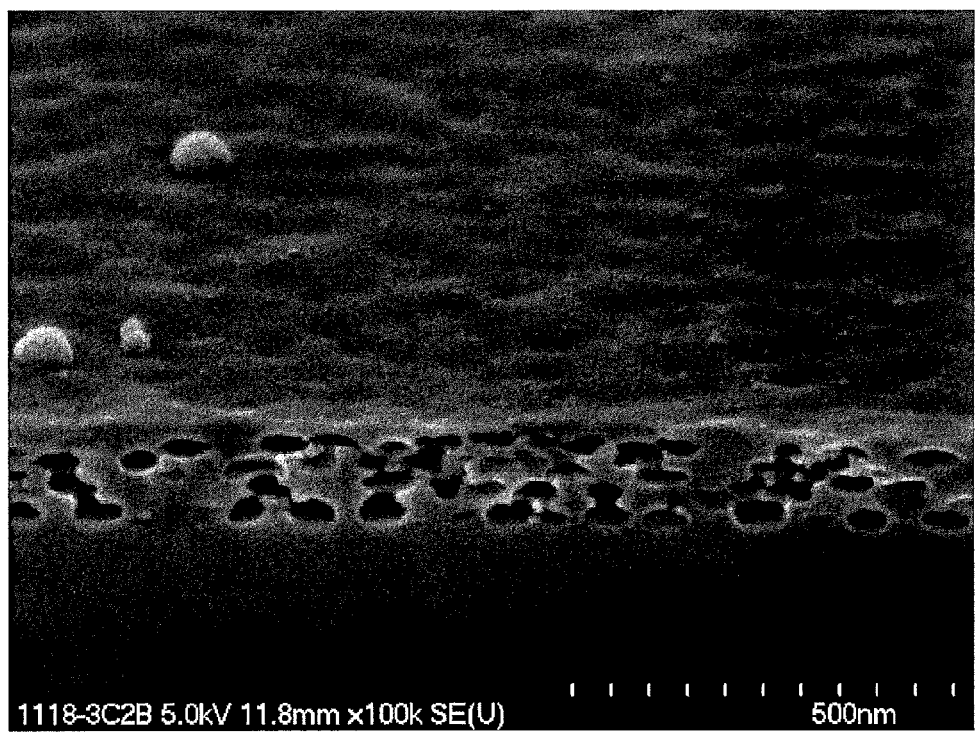
FIG. 1 shows a result of observation of a coated glass sheet of Example 1 with a field emission scanning electron microscope (FE-SEM).

Hereinafter, an embodiment of the present invention will be described in detail.

The coated glass sheet according to the present embodiment includes a glass sheet and a coating film provided on at least one principal surface of the glass sheet.

The glass sheet is not limited to a particular one. A glass sheet having a microscopically smooth surface is preferred to allow the coating film provided on the principal surface of the glass sheet to have a smooth surface. For example, the glass sheet may be a float glass sheet having a principal surface having such a smoothness that the arithmetic average roughness Ra is, for example, 1 nm or less and preferably 0.5 nm or less. The glass sheet may be a float glass sheet having a coating different from the coating film as defined in the present embodiment, the coating including a transparent conductive film and being formed on a principal surface of the glass sheet opposite to the principal surface on which the coating film of the present embodiment is to be formed. The arithmetic average roughness Ra as described herein corresponds to that as specified in JIS B 0601-1994.

The glass sheet may be a figured glass sheet with a surface having macroscopic asperities which are large enough to be observed with the naked eye. The macroscopic asperities as described herein refer to asperities for which the mean spacing Sm is on the order of millimeters as determined by setting an evaluation length on the order of centimeters in the roughness profile. In the present embodiment, the mean spacing Sm of the asperities on the surface of the figured glass sheet is preferably 0.3 mm or more, more preferably 0.4 mm or more, and even more preferably 0.45 mm or more, and is preferably 2.5 mm or less, more preferably 2.1 mm or less, even more preferably 2.0 mm or less, and particularly preferably 1.5 mm or less. The mean spacing Sm as described herein refers to an average of lengths of peak-valley periods in the roughness profile which are determined based on points at which the roughness profile intersects the mean line. It is further preferable that the surface asperities of the figured glass sheet have a maximum height Ry of 0.5 $\mu m$ to 10 $\mu m$, in particular 1 $\mu m$ to 8 $\mu m$, as well as having a mean spacing Sm within the above range. The mean spacing Sm and maximum height Ry as described herein correspond to those as specified in JIS (Japanese Industrial Standards) B 0601-1994. Even such a figured glass sheet can have an arithmetic average roughness Ra of several nanometers or less, in particular 1 nm or less, when the figured glass sheet is microscopically examined (such as in surface roughness measurement by atomic force microscope (AFM) observation in which the evaluation length in the roughness profile is several hundreds of nanometers). Thus, the figured glass sheet can be considered a glass sheet having a microscopically smooth surface and can be suitably used as a glass sheet in the coated glass sheet of the present embodiment.

It is preferable that the surface asperities of the figured glass sheet have an arithmetic average roughness Ra of 0.3 $\mu m$ to 5.0 $\mu m$, particularly 0.4 $\mu m$ to 2.0 $\mu m$, more particularly 0.5 $\mu m$ to 1.2 $\mu m$, as well as having a mean spacing Sm and a maximum height Ry within the above ranges. The figured glass sheet as described above exhibits a sufficient anti-glare effect attributed to its surface asperities. However, when the roughness parameters are excessively large, reflection color is likely to become uneven in the surface.

The glass sheet used may have a composition similar to those of common figured glass sheets or architectural glass sheets. The glass sheet is preferably as free of coloring components as possible. In the glass sheet, the content of iron oxide, which is a typical coloring component, is preferably 0.06 mass % or less and particularly preferably 0.02 mass % or less in terms of $Fe_2O_3$ content.

The coating film according to the present embodiment will next be described.

The coating film has a smooth surface. Having a "smooth surface" as defined herein means that when the surface is observed using an AFM with a 2.5-$\mu m$-square field of view and an evaluation length of 300 nm is set in a region where neither openings of open pores having a diameter of 5 nm or more nor granules are found, the arithmetic average roughness Ra of the surface over the evaluation length is 5 nm or less and preferably 3 nm or less.

The coating film includes: isolated closed pores present within the coating film; and a matrix. From another standpoint, the closed pores in the coating film can be said to be pores that are isolated within the film by being surrounded by the matrix. Air is believed to be present within the closed pores. The coating film has a reduced effective refractive index due to including such closed pores therein and can thus exert a low-reflection effect. This allows the coated glass sheet of the present embodiment to exhibit a transmittance gain as high as 2.5% or more even when the surface of the coated glass sheet has no asperities. The transmittance gain as defined herein refers to a value calculated by subtracting an average transmittance of the glass sheet as determined by applying light having wavelengths of 380 to 1100 nm to the glass sheet in the absence of the coating film on the surface of the glass sheet (before the coating film is provided on the surface of the glass sheet) from an average transmittance of the coated glass sheet as determined by applying light having the wavelengths to the coated glass. The transmittance gain can be increased to 2.6% or more or even to 2.9% or more by adjusting the shape and size of the closed pores and the porosity of the coating film to appropriate ranges specified in the following description.

The coated glass sheet of the present embodiment can exhibit a transmittance gain and an increase in transmittance as described above and thus have superior light transmission properties.

The coating film is substantially free of pores (open pores) that are open at the surface of the film. Saying that the coating film is substantially free of open pores means that the number of open pores per unit area of the surface of the coating film is less than 5 pores/$\mu m^2$ and preferably less than 0.2 pores/$\mu m^2$. The number of open pores per unit area is more preferably less than 0.16 pores/$\mu m^2$ and even more preferably less than 0.01 pores/$\mu m^2$. It is preferable for the coating film to have no open pores. The number of open pores per unit area is determined herein by observing the surface of the coating film using a scanning electron microscope (SEM) with a 2.5-$\mu$m-square field of view, counting the number of open pores, and dividing the counted number by the area of the field of view. Saying that the coating film has no open pores means that no open pores are found when three different regions of the surface of one sample of the coating film are observed with a 2.5-$\mu$m-square field of view. The open pores as described herein refer to pores that are found by SEM observation of the surface of the coating film and that have an opening with a diameter of 5 nm or more. When the number per unit area of pores open at the surface of the coating film is in the above range, matter such as a resin having adhered to the surface can easily be removed. It is therefore possible to prevent the yield of the production process from decreasing due to the presence of adhering matter.

The closed pores may be approximately elliptical when viewed in a cross-section along the thickness direction of the coating film. For example, the closed pores, when viewed in the above cross-section, include first closed pores that are approximately elliptical isolated pores and second closed pores each formed of two or more approximately elliptical pores connected to each other.

The first closed pores and the approximately elliptical pores forming the second closed pores each have, for example, a major axis with a length of 30 to 80 nm and a minor axis with a length of 20 to 30 nm. The length of the major axis refers to the largest diameter of the approximately elliptical pore observed in the above cross-section, and the length of the minor axis refers to the diameter of the pore in a direction orthogonal to the major axis. The length of the major axis may be 20 to 80 nm or 30 to 70 nm. The length of the minor axis may be 10 to 40 nm or 15 to 30 nm.

The first closed pores and the approximately elliptical pores forming the second closed pores may be arranged so that their major axes extend substantially along the surface of the coating film. In this case, the three-dimensional shape of the first closed pores and the three-dimensional shape of the approximately elliptical pores forming the second closed pores can be considered an oblate, approximately spheroidal shape whose axis of rotation extends along the thickness direction of the coating film.

As described above, the coating film has a porous structure including closed pores therein. The higher the porosity of the coating film is, the lower the apparent refractive index of the coating film is, and the more reduced the reflectance of the coated glass sheet is. However, having an excessively high porosity leads to reduction in the durability of the coating film. For these reasons, the porosity of the coating film is preferably 10 to 40% and more preferably 15 to 30%.

The thickness of the coating film is, for example, 50 to 300 nm and preferably 100 to 250 nm.

The coating film may include granules present in the surface of the film. However, if too many granules are present in the surface of the film, the light transmission properties of the coated glass sheet may be deteriorated or the ease of removal of matter adhering to the coated glass sheet may be reduced. Thus, the number of granules of 20 to 100 nm diameter found in the surface of the coating film by SEM observation of the surface of the coating film is preferably 100 granules/$\mu m^2$ or less, more preferably 75 granules/$\mu m^2$ or less, and particularly preferably 50 granules/$\mu m^2$ or less. The number of granules of 20 to 100 nm diameter found in the surface of the coating film by SEM observation of the surface of the coating film may be, for example, 10 granules/$\mu m^2$ or more.

In the surface of the coating film, a region free of the openings of the open pores (and free of the above granules when the granules are present in the surface) has such a surface roughness that the arithmetic average roughness Ra is, for example, 3 nm or less as determined over an evaluation length of 300 nm.

As described above, the coating film includes a matrix. This matrix can contain a metal oxide containing silicon, titanium, aluminum, zirconium, and/or tantalum. The matrix preferably contains an oxide of silicon (in particular silica) as a main component. The main component of the matrix, as defined herein, refers to a component whose content is highest in the matrix.

Silica has high affinity for a glass sheet containing silicon oxide as a main component, and thus the use of silica can increase the durability of the coating film. Additionally, silica has a low refractive index, and thus the use of silica can further decrease the apparent refractive index of the coating film, providing a further increase in transmittance gain. As described below, a metal compound other than an oxide of silicon may be incorporated in the matrix to achieve an effect such as a further improvement in durability As the source of the matrix (matrix raw material) there can be used hydrolyzable metal compounds typified by silicon alkoxides. Such a hydrolyzable metal compound can be formed into the matrix by a so-called sol-gel process in which the hydrolyzable metal compound is hydrolyzed and polycondensed.

When the matrix of the coating film contains silica, a hydrolyzable silicon compound is used as the matrix raw material. In this case, the silica forming the matrix is derived from a product of hydrolysis and condensation of the hydrolyzable silicon compound.

The hydrolyzable silicon compound used is, for example, a silicon alkoxide. In the present embodiment, the silicon alkoxide preferably includes a silicon alkoxide having one or two organic groups directly bonded to a silicon atom and more preferably consists of a silicon alkoxide having one or two organic groups directly bonded to a silicon atom, because in these cases a coating film having the structural characteristics as described above can more easily be obtained. The organic group(s) is (are) preferably hydrophobic. In other words, a silicon alkoxide having one or two non-hydrolyzable functional groups is suitably used. This is because, as described below, a coating film having a porous structure including closed pores therein can be effectively produced when the hydrolyzable silicon compound consists of a silicon alkoxide having one or two organic groups directly bonded to a silicon atom. Examples of the organic group(s) directly bonded to a silicon atom include a linear alkyl group having 1 to 5 carbon atoms. Specific examples of the silicon alkoxide include methyltrimethoxysilane, dimethyldimethoxysilane, methyltriethoxysilane, and dimethyldiethoxysilane. In this case, the product of hydrolysis and condensation of the hydrolyzable silicon compound contains an organic group derived from a non-hydrolyzable functional group.

The matrix of the coating film preferably contains no organic group, although it is acceptable for the matrix to contain an organic group. This is because the matrix has higher durability and wear resistance when containing no organic group.

When the main component of the matrix of the coating film is silica, the matrix may further contain an oxide of at least one element selected from the group consisting of aluminum, titanium, and zirconium. The matrix further containing such an oxide provides an improvement in the durability of the coating film. When the matrix of the coating film contains such a metal oxide, it is preferable to add a water-soluble inorganic compound such as a metal chloride or oxychloride to the matrix raw material.

The matrix of the coating film preferably contains 90 to 100 mass % of silica and more preferably contains 94 to 100 mass % of silica. When the matrix of the coating film contains an oxide of at least one element selected from the group consisting of aluminum, titanium, and zirconium, the oxide is contained in the coating film preferably in an amount of 2 to 7 mass %, more preferably in an amount of 3 to 6 mass %.

The coating film may further include, for example, fine solid particles in addition to the closed pores, open pores, and matrix. When the coating film includes fine solid particles, the coating film has an improved durability. The fine solid particles are bound by the matrix. The fine solid particles have, for example, an average particle diameter of 10 to 100 nm. The fine solid particles may be approximately spherical primary particles having a particle diameter within the above range or may be secondary particles having a particle diameter within the above range and composed of agglomerates of primary particles having a smaller particle diameter. A greater average particle diameter is more preferred in terms of improvement in durability of the coating film. However, it is not preferable that the average particle diameter be excessively large, because in this case the amount of granules present in the surface of the coating film is so large that removal of matter adhering to the coating film becomes difficult. The fine solid particles used can be, for example, fine silica particles. The average particle diameter of the fine solid particles is determined by observing a cross-section of the coating film with a SEM. Specifically, 50 particles the entirety of each of which is observable are randomly selected, the largest and smallest diameters of each particle are measured, the average of the largest and smallest diameters is determined as the particle diameter of the particle, and the average of the particle diameters of the 50 particles is determined as the "average particle diameter".

The closed pores included in the coating film and the open pores which may be included in the coating film can be formed by any appropriate method. The closed pores and open pores are preferably derived from fine particles that are contained as a pore forming agent in a coating liquid for forming the coating film and that are lost by heat treatment at a temperature equal to or higher than a predetermined temperature. Such fine particles are used, so to speak, as a "mold", and are finally lost by heat treatment. The spaces originally occupied by the fine particles remain in the form of pores in the coating film. The pores thus formed are the closed pores or open pores. Fine particles that can be used as a pore forming agent are those which are lost by evaporation, thermal decomposition, or burning in heat treatment performed, for example, at 400° C. or higher or preferably at 600° C. or higher.

The fine particles used as a pore forming agent are, for example, fine organic polymer particles. The fine organic polymer particles preferably have a polar group on their surfaces. An example of the polar group is a hydrophilic group, examples of which include a hydroxy group, a carbonyl group, and a carboxyl group. Other examples of the polar group include, but are not limited to, an acryloyl group and a (meth)acryloyl group (which are collectively referred to as methacryloyl groups). The fine organic polymer particles preferred are less prone to separation in the coating liquid and are suitable for effective formation of a coating film having a porous structure including closed pores therein. The average particle diameter of the fine organic polymer particles is preferably 10 to 200 nm, more preferably 20 to 150 nm, and particularly preferably 30 to 100 nm. The average particle diameter of the fine organic polymer particles is determined by light scattering particle size distribution analysis.

The coated glass sheet of the present embodiment may further include a contact angle-increasing film provided on the coating film. The contact angle-increasing film is a film on which liquids form a large contact angle when adhering to the film. The water repellency and oil repellency of the surface of the coated glass sheet are higher in the presence of the contact angle-increasing film on the coating film than in the absence of the contact angle-increasing film. Thus, the coated glass sheet provided with the contact angle-increasing film has good antifouling properties; for example, fouling matter having adhered to the surface of the sheet during processing can easily be removed. This can eliminate the problem of appearance defect caused by adhesion of fouling matter, thus making it possible to increase the yield of the production process.

The material of the contact angle-increasing film is not particularly limited, since the contact angle-increasing film is only required to increase the contact angle of liquids on the surface of the coating film. For example, a hydrolysate of a hydrolyzable silicon compound having a hydrophobic group directly bonded to silicon atom is suitably used. In the compound, one or two hydrophobic groups are preferably bonded to silicon atom, and the hydrolyzable group is preferably an alkoxy group, an acetone group, an alkenyloxy group, an amino group, or a halogen group. The hydrophobic group(s) is (are) preferably an alkyl group, a fluoroalkyl group, or an alkenyl group, and the hydrophobic group(s) preferably has (have) 1 to 30 carbon atoms, more preferably 1 to 6 carbon atoms. Specifically, the hydrophobic group(s) is (are) preferably a methyl group, an ethyl group, or a vinyl group, and the hydrolyzable group is preferably a methoxy group or an ethoxy group. Another example of the material of the contact angle-increasing film is a commercially-available fluorinated surface antifouling agent, examples of which include a fluoroalkyl-containing silane compound and a perfluoropolyether-containing silane compound.

The thickness of the contact angle-increasing film is preferably selected according to the properties such as the water repellency of the material used. The thickness of the contact angle-increasing film can be, for example, 1 nm to 50 nm.

The contact angle on the contact angle-increasing film is not particularly limited, since it is sufficient for the contact angle to be larger than that on the surface of the coating film. For example, the water contact angle on the contact angle-increasing film is 50 to 110° and preferably 70 to 110°.

The coated glass sheet of the present embodiment can be produced, for example, by a production method including:
(i) applying a coating liquid containing a matrix raw material and a pore forming agent onto one principal surface of a glass sheet to form a wet film on the one principal surface of the glass sheet;
(ii) drying the wet film; and
(iii) calcining the dried film.

The pore forming agent contained in the coating liquid is as described above. The matrix raw material is a hydrolyzable metal compound that can be formed into a matrix by a so-called sol-gel process in which the hydrolyzable metal compound is hydrolyzed and polycondensed. The details of the matrix raw material are as described above.

When the coating liquid contains a hydrolyzable silicon compound as the matrix raw material and contains fine organic polymer particles as the pore forming agent, the content of the fine organic polymer particles is preferably 12 to 38 parts by mass, more preferably 15 to 35 mass %, and particularly preferably 17 to 25 mass %, relative to 100 parts by mass of a product of hydrolysis and condensation of the hydrolyzable silicon compound. When the coating liquid contains the fine organic polymer particles in the above proportion, it is easy to form closed pores within the coating film so that a transmittance gain of 2.5% or more can be achieved.

The coating liquid may, if desired, contain another component such as a hydrolysis catalyst, leveling agent, surfactant, or solvent in addition to the matrix raw material and the pore forming agent. The hydrolysis catalyst is used to promote the hydrolysis of the hydrolyzable metal compound contained as the matrix raw material. The leveling agent and surfactant are used to improve the leveling of the wet film formed by application of the coating liquid, improve the wetting properties of the coating liquid to the glass sheet, and reduce the unevenness of application of the coating liquid.

The solids concentration of the coating liquid is not particularly limited. The coating liquid can be freely diluted with a solvent to have an appropriate solids concentration that leads to prevention of uneven application of the coating liquid and prevention of occurrence of defects such as cracks during the drying and calcination steps and that allows the coating film to have a thickness within a given range.

When the coating liquid contains a hydrolyzable metal compound as the matrix raw material, a hydrolysate of the hydrolyzable metal compound is contained in the coating liquid. Thus, the hydrolyzable metal compound may be hydrolyzed in the coexistence of the pore forming agent to prepare a coating liquid containing a hydrolysate. Alternatively, a hydrolysate solution may be prepared first by hydrolyzing the hydrolyzable metal compound and may then be mixed with the pore forming agent to prepare a coating liquid.

The coating liquid as described above is applied to a predetermined thickness on one principal surface of a glass sheet to form a wet film. The technique for application of the coating liquid is not particularly limited, and any known application techniques can be used as appropriate. Among known application techniques, roll coating and spray coating are preferred in terms of mass production efficiency.

Next, the resulting wet film is dried. When the hydrolyzable metal compound contained in the coating liquid is composed of a hydrolyzable silicon compound having one or two hydrophobic organic groups directly bonded to a silicon atom and the fine organic polymer particles contained as the pore forming agent have a hydrophilic group on their surfaces, the hydrolyzable silicon compound and the fine organic polymer particles are rearranged in the wet film, and the structure resulting from the rearrangement is fixed by the drying. In this rearrangement, the hydrolysate, which has a hydrophobic group, moves to the vicinity of the side of the wet film remote from the glass sheet which is highly hydrophilic (namely, the vicinity of the free surface of the wet film) and forms a smooth surface due to surface tension. By contrast, the fine organic polymer particles, which have a hydrophilic group, have a tendency to move toward the surface of the glass sheet and rarely protrude from the free surface of the wet film. Thus, a porous structure free of open pores can be effectively formed. This drying step causes evaporation of the solvent from the wet film and also induces condensation of the hydrolysate. The temperature and time for drying of the wet film are not particularly limited. For example, the wet film may be placed in a heating furnace set at 300 to 400° C. for 20 to 120 seconds. In this case, the surface temperature of the film reaches 100 to 150° C. It is believed that most of the pore forming agent remain without being lost after this drying step.

The dried film obtained by the drying step is subsequently calcined. This calcination step causes the pore forming agent to be lost by evaporation, thermal decomposition, or burning, resulting in formation of pores. The calcination temperature and calcination time are not particularly limited. An example of the calcination is calcination at 400 to 500° C. for 1 to 5 minutes. Another example is calcination at 600° C. or higher for 1 minute or more. In the former example of calcination, the pore forming agent is lost, while most of the organic groups contained in the matrix remain without being lost. In the latter example of calcination, both the pore forming agent and the organic groups of the matrix are lost, so that the resulting matrix contains no organic group and that the coating film has high durability and wear resistance. Preferred examples of the calcination conditions include the heating conditions employed in thermal tempering of commercially-available soda-lime glass sheets. For example, the dried film may be placed in a heating furnace set at 640 to 780° C. for 1 to 3 minutes. In this case, the surface temperature of the dried film reaches 630 to 690° C. The reason why the first closed pores and the pores forming the second closed pores have an approximately elliptical shape as described above is believed to be that the dried film shrinks in its thickness direction in the calcination step and the already-formed pores correspondingly shrinks in the thickness direction of the dried film.

With the method described above, the coated glass sheet of the present embodiment can be produced.

When the contact angle-increasing film is to be further formed on the coating film, a treatment liquid containing a material for forming the contact angle-increasing film may be applied onto the surface of the coating film of the coated glass sheet. The treatment liquid can be prepared by adding a solvent to the material for forming the contact angle-increasing film.

EXAMPLES

Hereinafter, the present invention will be described in more detail with reference to examples. However, the present invention is not limited to the examples given below, and modifications can be made without departing from the gist of the present invention.

First, methods for evaluation of various properties of coated glass sheets produced in Examples and Comparative Examples will be described.

(Transmittance Gain)

Transmittance curves (transmission spectra) of glass sheets were measured using a spectrophotometer (UV-3100, an ultraviolet-visible spectrophotometer manufactured by Shimadzu Corporation) before and after the formation of coating films. The average transmittance was calculated by averaging the values of transmittance in the wavelength range of 380 to 1100 nm. The increase in average transmittance of each glass sheet provided with a coating film relative to the glass sheet unprovided with the coating film was determined as a transmittance gain.

(Ease of Removal of Adhering Matter: Part 1)

A commercially-available laminated glass interlayer for solar cells (EVA SKY, an ethylene-vinyl alcohol copolymer material manufactured by Bridgestone Corporation) was cut into a 20×30 mm piece, the piece of the interlayer was put on the coating film of the coated glass sheet, and the coated glass sheet was placed in an oven set at 150° C. for 5 minutes. After that, the coated glass sheet was taken out of the oven and left to cool to room temperature, and then the interlayer was stripped from the coated glass sheet.

The region of the coated glass sheet on which the interlayer had been placed was rubbed with a cellulose-based non-woven fabric (BEMCOT (registered trademark) manufactured by Asahi Kasei Fibers Corporation) impregnated with ethanol, and thus the interlayer material remaining adhered to the coating film after the stripping of the interlayer was wiped off. This wiping can remove the interlayer material remaining on the surface of the coating film, but cannot remove the interlayer material having penetrated into the coating film.

The difference in reflection color between the wiped region (referred to as "adhesion portion") of the coating film to which the interlayer material had adhered and the region (referred to as "non-adhesion portion") on which the interlayer was not placed was visually examined, and the antifouling properties of the coating film were evaluated according to the following criteria.

Excellent: There was little difference in reflection color between the adhesion portion and the non-adhesion portion.

Good: There was a difference in reflection color between the adhesion portion and the non-adhesion portion, but the difference was slight.

Poor: There was a clear difference in reflection color between the adhesion portion and the non-adhesion portion.

(Ease of Removal of Adhering Matter: Part 2)

The ease of removal of adhering matter was tested in the same manner as in "Ease of removal of adhering matter: Part 1" described above, except that the time during which the coated glass sheet with the interlayer placed on the coating film was placed in the oven set at 150° C. was changed to 30 minutes. The criteria for evaluation of the antifouling properties were also the same as those employed in "Ease of removal of adhering matter: Part 1".

(Salt Water Resistance)

A salt spray test was conducted to evaluate the salt water resistance of the coating film. First, the average transmittance was measured for the coated glass sheet in the same manner as for the evaluation made in "Transmittance gain" described above. After that, the coating film was exposed to salt spray according to JIS C 8917:2005, Annex 4, and then the average transmittance was measured again. The absolute value of the difference calculated by subtracting the average transmittance as determined before the exposure to salt spray from the average transmittance as determined after the exposure to salt spray was employed as a measure of the salt water resistance. The exposure to salt spray was carried out by spraying the coating film with a mist of aqueous NaCl solution having a temperature of 35° C. and a concentration of 5 mass % for 96 hours, after which the surface of the coating film was washed with running water.

(Number of Open Pores Per Unit Area)

The coating film was observed with a field emission scanning electron microscope (S-4500, manufactured by Hitachi, Ltd.). Specifically, the surface of the coating film was observed using a FE-SEM with a 2.5-μm-square field of view, the number of openings of 5 nm or more diameter found in the surface was counted, and the counted number was divided by the area of the field of view to determine the number of open pores per unit area (pores/μm$^2$). When three different regions of the surface of one sample of the coating film were observed with a 2.5-μm-square field of view and no open pores were found in any of the three regions, it was determined that "open pores were not included" in the coating film.

(Surface Smoothness of Coating Film)

The surface of the coating film was observed using an AFM ("SPF-400", manufactured by SII Nanotechnology Inc.) with a 2.5-μm-square field of view. An evaluation length of 300 nm was set in a region where neither openings of open pores having a diameter of 5 nm or more nor granules were found, and the arithmetic average roughness Ra was determined over the evaluation length using an analysis software ("Nano Navi", manufactured by SII Nanotechnology Inc.) supplied with the AFM system.

Example 1

<Preparation of Coating Liquid for Forming Coating Film>

In Example 1, methyltriethoxysilane (MTES) was used as a matrix raw material for a coating film. Thus, a MTES hydrolysate solution was prepared first. Specifically, 64.38 g of isopropyl alcohol (solvent), 8.05 g of purified water, 1.00 g of 1 N nitric acid (hydrolysis catalyst), and 26.57 g of MTES were weighed into a glass bottle, and a hydrolysis reaction was allowed to proceed at 40° C. for 8 hours, resulting in a hydrolysate solution (MTES hydrolysate solution) having a solids concentration of 10 mass %. Next, 3.00 g of this MTES hydrolysate solution, 6.25 g of isopropyl alcohol (solvent), 0.30 g of 3-methoxy-1-butanol (solvent), and 0.75 g of a fine organic polymer particle dispersion (pore forming agent) ("EPOSTAR MX-050", crosslinked polymethylmethacrylate dispersion, manufactured by NIPPON SHOKUBAI CO., LTD., containing fine particles with an average particle diameter of 0.05 to 0.10 μm, and having a solids concentration of 10.0 mass %) were placed in a glass container to obtain a coating liquid. The mass % of the matrix raw material shown for the coating liquid in Table 1 represents the percentage of the mass of a product of hydrolysis and condensation of the substance used as the matrix raw material to the mass of the coating liquid. The parts by mass of the pore forming agent represents the parts by mass of the pore forming agent relative to 100 parts by mass of the matrix raw material contained in the coating liquid. The mass % of isopropyl alcohol, the mass % of 3-methoxy-1-butanol, and the mass % of water each represent the percentage of the mass of the substance added in the preparation of the coating liquid to the mass of the coating liquid, and are exclusive of the mass % of alcohol or water produced as a by-product in the hydrolysis and condensation.

<Preparation of Glass Sheet>

In Example 1, the glass sheet used was a figured glass sheet. This figured glass sheet is a 3.2-mm-thick glass sheet manufactured by Nippon Sheet Glass Co., Ltd. This figured glass sheet has a common soda-lime-silicate composition and has surface asperities for which the arithmetic average roughness Ra and the mean spacing Sm are 0.76 μm and 1120 μm, respectively, as determined over an evaluation length of 1 cm (according to JIS B 0601-1994). This figured glass sheet was cut into a 100×100 mm piece, which was immersed in an alkaline solution (a 25 wt % aqueous KOH solution) and washed with the aid of an ultrasonic cleaner. The piece of the figured glass was then washed with deionized water and dried at ordinary temperature. The resulting glass sheet was used for formation of a coating film. The transmission properties of this glass sheet were examined as described above before coating film formation and, as a result, the average transmittance was determined to be 91.7%.

<Formation of Coating Film>

The coating liquid was applied by spin coating. Specifically, the glass sheet as prepared above was horizontally positioned in a spin coating system, 0.17 cc of the coating liquid was dripped onto the central portion of the glass sheet, and the glass sheet was rotated at 600 rpm and kept rotating at this rotation speed for 10 seconds, after which the rotation of the glass sheet was stopped. This resulted in the formation of a wet film on one principal surface of the glass sheet. Subsequently, the wet film was dried by removing the solvent from the wet film. The drying was carried out as follows: The glass sheet with the wet film formed on one principal surface thereof was placed in an electric furnace set at 350° C. for 60 seconds, after which the glass sheet was taken out of the electric furnace and left to cool to room temperature. Next, the dried film was calcined. The calcination was accomplished by placing the dried film in an electric furnace set at 760° C. for 5 minutes. In this process, the surface temperature of the dried film reached 665° C. A FE-SEM photograph of the resulting coating film is shown in FIG. 1.

Example 2

A coated glass sheet of Example 2 was produced in the same manner as in Example 1, except that 0.53 g of another fine organic polymer particle dispersion, "EPOSTAR MX-030" (manufactured by NIPPON SHOKUBAI CO., LTD., containing fine particles with an average particle diameter of 0.03 to 0.05 μm, and having a solids concentration of 10.0 mass %), was used instead of "EPOSTAR MX-050" in the preparation of a coating liquid, and that the rotation speed of the glass sheet during application of the coating liquid was changed to 550 rpm.

Example 3

A coated glass sheet of Example 3 was produced in the same manner as in Example 1, except that the amount of the fine organic polymer particle dispersion added in the preparation of a coating liquid was changed to 0.45 g.

Example 4

A coated glass sheet of Example 4 was produced in the same manner as in Example 1, except that the amount of the fine organic polymer particle dispersion added in the preparation of a coating liquid was changed to 1.05 g.

Comparative Example 1

<Preparation of Coating Liquid for Forming Coating Film>

Figure 2:
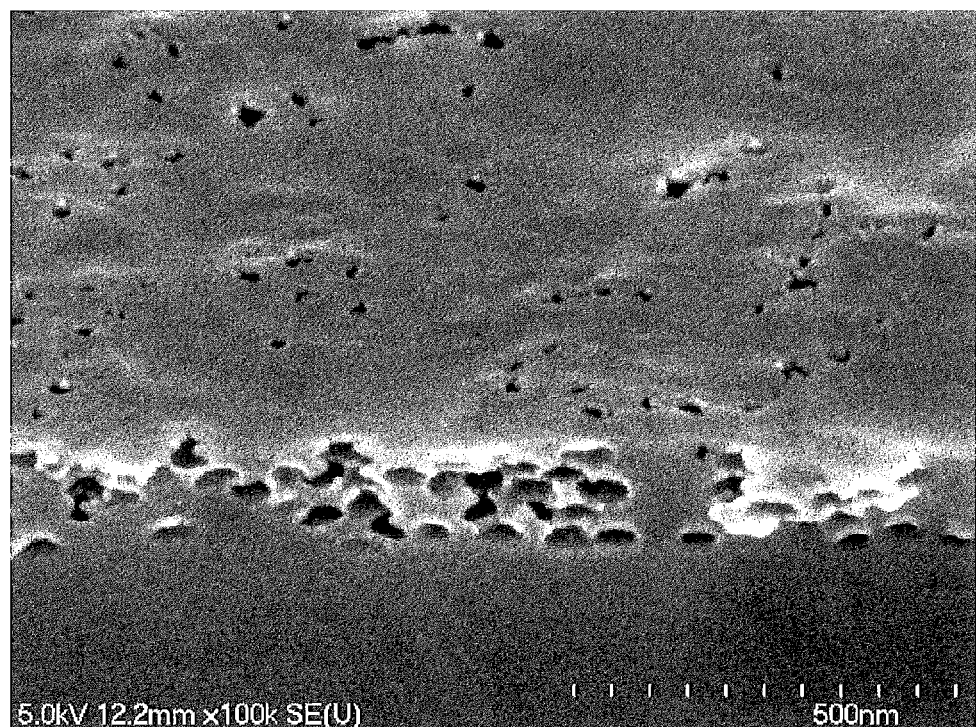
FIG. 2 shows a result of observation of a coated glass sheet of Comparative Example 1 with a field emission scanning electron microscope (FE-SEM).
Figure 3:
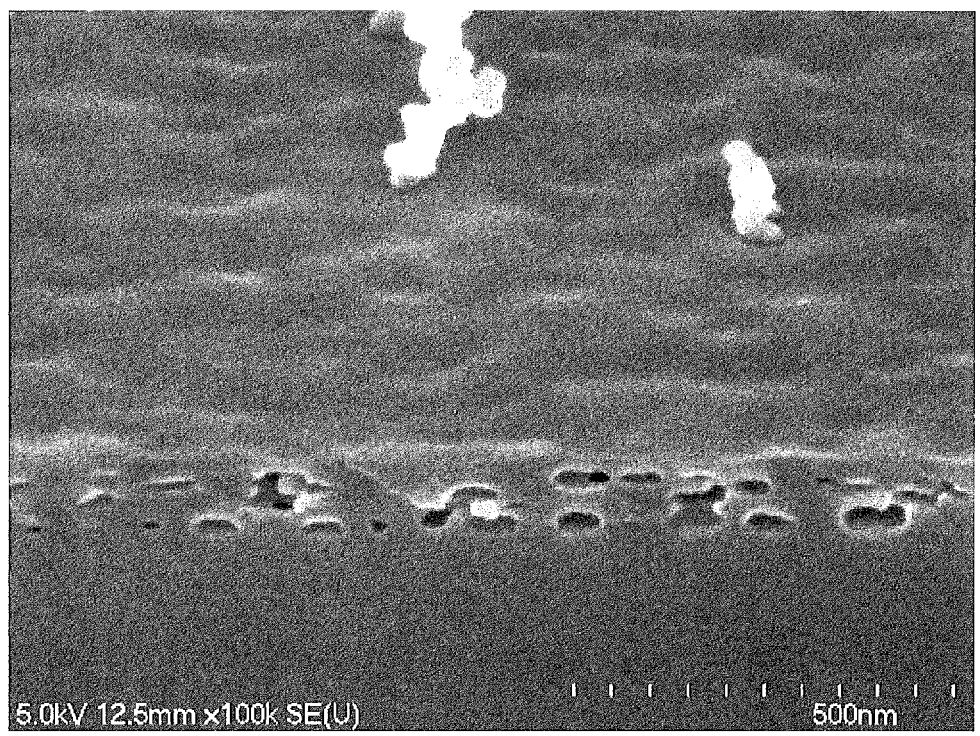
FIG. 3 shows a result of observation of a coated glass sheet of Comparative Example 2 with a field emission scanning electron microscope (FE-SEM).

In Comparative Example 1, tetraethoxysilane (TEOS) was used as a matrix raw material for a coating film. Thus, a TEOS hydrolysate solution was prepared first. Specifically, 52.33 g of isopropyl alcohol (solvent), 12.00 g of purified water, 1.00 g of 1 N nitric acid (hydrolysis catalyst), and 34.67 g of TEOS were weighed into a glass bottle, and a hydrolysis reaction was allowed to proceed at 40° C. for 8 hours, resulting in a hydrolysate solution having a solids concentration of 10 mass %. Next, 2.00 g of this TEOS hydrolysate solution, 6.70 g of isopropyl alcohol (solvent), 0.50 g of purified water, 0.30 g of 3-methoxy-1-butanol (solvent), and 0.50 g of a fine organic polymer particle dispersion (pore forming agent) ("EPOSTAR MX-050", manufactured by NIPPON SHOKUBAI CO., LTD., containing fine particles with an average particle diameter of 0.05 to 0.10 μm, and having a solids concentration of 10.0 mass %) were placed in a glass container to obtain a coating liquid. A FE-SEM photograph of the resulting coating film is shown in FIG. 2.

The preparation of a glass sheet and the formation of a coating film in Comparative Example 1 were the same as in Example 1.

Comparative Example 2

<Preparation of Coating Liquid for Forming Coating Film>

An amount of 3.00 g of a MTES hydrolysate solution, 6.40 g of isopropyl alcohol, 0.30 g of 3-methoxy-1-butanol, and 0.30 g of a fine organic polymer particle dispersion ("EPOSTAR MX-050", manufactured by NIPPON SHOKUBAI CO., LTD., containing fine particles with an average particle diameter of 0.05 to 0.10 μm, and having a solids concentration of 10.0 mass %) were placed in a glass container to obtain a coating liquid. The MTES hydrolysate solution used in Comparative Example 2 was prepared in the same manner as in Example 1.

The preparation of a glass sheet and the formation of a coating film in Comparative Example 2 were the same as in Example 1.

Comparative Example 3

A coated glass sheet of Comparative Example 3 was produced in the same manner as in Comparative Example 2, except that the amount of the fine organic polymer particle dispersion added was changed to 1.20 g.

As shown in Table 1, the coating films of the coated glass sheets of Examples 1 to 4 had a smooth surface, and no openings of open pores were found in the surfaces of the coating films by observation with a 2.5-μm-square field of view. The coated glass sheets of Examples 1 to 4 were superior in terms of the ease of removal of adhering matter and also had high salt water resistance. The coated glass sheets of Examples 1 to 4 each had closed pores present within the coating film as seen from the SEM photograph and showed a transmittance gain of 2.5% or more. By contrast, the coating film of Comparative Example 1 failed to have a smooth surface, and the number of open pores open at the surface of the coating film was 10 pores/μm$^2$ or more. This was why the coated glass sheet of Comparative Example 1 was inferior in terms of the ease of removal of adhering matter. As for the coating film of Comparative Example 2, a sufficient number of closed pores were not formed within the coating film partly because of an excessively small amount of the fine organic polymer particles added for the formation of the coating film, and the transmittance gain was consequently low. As for the coating film of Comparative Example 3, too many closed pores were formed within the coating film partly because of an excessively large amount of the fine organic polymer particles added for the formation of the coating film, and the transmittance gain was consequently low.

Example 5

In Example 5, the application of a coating liquid was carried out using a roll coater and followed by a thermal tempering step. That is, in Example 5, heating corresponding to the calcination in Example 1 was immediately followed by an additional step of rapid cooling by air blow to produce a coated glass sheet in the form of a strengthened glass sheet. The details will be described hereinafter.

First, a coating liquid and a glass sheet identical to those used in Example 1 were prepared. The application of the coating liquid was carried out using a roll coater in such a manner that the coating thickness would be 1 μm to 5 μm. In this way, a wet film was formed on one principal surface of the glass sheet. The temperature of the glass sheet at the start of the application of the coating liquid was adjusted within the range of 20 to 25° C.

The drying following the application was carried out by passing the glass sheet with the wet film formed on one principal surface thereof through a heating furnace of the continuous conveyor type. At the moment when the glass sheet exited the heating furnace, the surface temperature of the film was 140° C. After that, the glass sheet was left to cool to room temperature.

Subsequently, the glass sheet having a dry film formed thereon was subjected to thermal tempering. The thermal tempering was accomplished as follows: The glass sheet was placed in an electric furnace set at 700° C. for 180 seconds, after which the glass sheet was taken out of the electric furnace and rapidly cooled by blowing air at ordinary temperature onto the glass sheet. At the moment when the glass sheet was taken out of the electric furnace, the surface temperature of the glass sheet was 650° C.

In the rapid cooling, the cooling rate over the temperature range from 650 to 550° C. was 80 to 100° C./sec. A surface compressive stress ranging from 90 to 110 MPa was induced in the resulting strengthened glass sheet.

Figure 4:
FIG. 4 shows a result of observation of a coated glass sheet of Example 5 with a field emission scanning electron microscope (FE-SEM).
Figure 5:
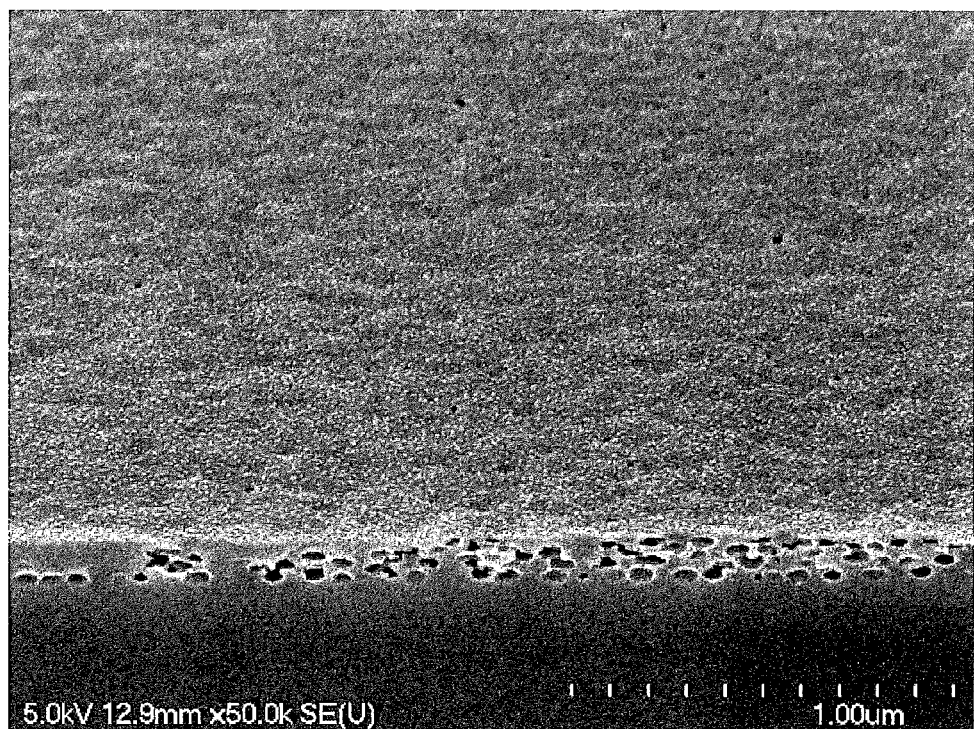
FIG. 5 shows a result of observation of the coated glass sheet of Example 5 with a field emission scanning electron microscope (FE-SEM).

FE-SEM photographs of the resulting coating film taken with two randomly selected fields of view are shown in FIG. 4 and FIG. 5, respectively. The coating film of the coated glass sheet of Example 5 had a smooth surface; however, the surface of the coating film had both a region (FIG. 4) where no openings of open pores were found in a 2.5-μm-square field of view and a region (FIG. 5) where openings of open pores were found in a 2.5-μm-square field of view. In the region where openings of open pores were found, the number of the open pores was 4 pores/μm$^2$. The smoothness of the coating film was such that the arithmetic average roughness Ra was 4.75 nm.

It has not yet been clarified whether the formation of open pores and the difference in smoothness are associated with the addition of rapid cooling by air blow. The coating film of Example 5 showed superior performance in terms of transmittance gain and salt water resistance; specifically, the transmittance gain was 2.80%, and the salt water resistance was 0.03%.

Example 6

In Example 6, a fluorinated water-repellent agent serving as a contact angle-increasing agent was applied onto the coating film of the coated glass sheet as produced in Example 5 to form a contact angle-increasing film on the coating film.

An amount of 1.05 g of tridecafluorooctyltriethoxysilane (represented by $CF_3(CF_2)_5C_2H_4Si(OC_2H_5)_3$), which is a type of fluorinated water-repellent agent, was dissolved in 40.6 g of ethanol, and the resulting solution was stirred for 1 hour. This was followed by addition of 0.8 g of ion-exchanged water and 1.0 g of 0.1 N hydrochloric acid and by further stirring for 1 hour. A treatment liquid was thus obtained.

A volume of 3 mL of this treatment liquid was put on a cotton cloth, with which the treatment liquid was spread on the surface of the coating film of the coated glass sheet of Example 5. After that, an excess of the treatment liquid was wiped off with another cotton cloth impregnated with ethanol. A coated glass sheet of Example 6 was thus obtained.

Example 7

Example 7 is a variation of Example 6; in Example 7, methyltriethoxysilane was applied as a contact angle-increasing agent instead of the fluorinated water-repellent agent.

A treatment liquid was obtained in the same manner as in Example 6, except for using 0.22 g of methyltriethoxysilane instead of 1.3 g of tridecafluorooctyltriethoxysilane.

A volume of 3 mL of this treatment liquid was put on a cotton cloth, with which the treatment liquid was spread on the surface of the coating film of the coated glass sheet of Example 5. After that, an excess of the treatment liquid was wiped off with a dry, unimpregnated cotton cloth. A coated glass sheet of Example 7 was thus obtained.

Example 8

Example 8 is another variation of Example 6; in Example 8, a commercially-available fluorinated water repellency-imparting agent was applied as a contact angle-increasing agent.

A commercially-available anti-fingerprint agent for glass, "OPTOOL DSX" (manufactured by DAIKIN INDUSTRIES, LTD.; a solution of fluorocarbon compound diluted with perfluorohexane to a concentration of 20%), was further diluted with perfluorohexane to prepare a 0.1 wt % solution. A coated glass sheet of Example 8 was obtained in the same manner as in Example 7, except for using this treatment liquid.

The coating films of Examples 6 to 8 having a contact angle-increasing film formed thereon showed a clear improvement in the ease of removal of adhering matter, as compared to the coating film of Example 5.

Example 9

In Example 9, a coated glass sheet was produced in which a contact angle-increasing film was provided on the coating film of the coated glass sheet as produced in Example 1. The contact angle-increasing film was formed using the below-described coating liquid for contact angle-increasing film formation.

<Preparation of Coating Liquid for Contact Angle-Increasing Film Formation>

There was prepared a MTES hydrolysate solution (solids concentration: 10 mass %) identical to the MTES hydrolysate solution used in Example 1 to prepare a coating liquid for porous layer formation. This MTES hydrolysate solution was diluted with IPA to a solids concentration of 3 mass %. An amount of 0.67 g of the diluted MTES hydrolysate solution having a solids concentration of 3 mass %, 8.83 g of IPA, 0.26 g of a 1 mass % aqueous solution of zirconium oxychloride octahydrate ($ZrOCl_2 \cdot 8H_2O$), and 0.24 g of a 1 mass % aqueous solution of aluminum chloride hexahydrate ($AlCl_3 \cdot 6H_2O$) were mixed to obtain a coating liquid for contact angle-increasing film formation.

<Formation of Contact Angle-Increasing Film>

A coated glass sheet identical to the coated glass sheet of Example 1 was prepared. The coated glass sheet prepared was horizontally positioned in a spin coating system, the coating liquid for contact angle-increasing film formation was dripped onto the central portion of the coating film, and the glass sheet was rotated at 1000 rpm and kept rotating at this rotation speed for 10 seconds, after which the rotation of the glass sheet was stopped. This resulted in the formation of a wet film for contact angle-increasing film formation on the coating film. Subsequently, the wet film for contact angle-increasing film formation was dried by removing the solvent from the wet film. The drying was carried out as follows: The coated glass sheet with the wet film for contact angle-increasing film formation was placed in an electric furnace set at 350° C. for 60 seconds, after which the coated glass sheet was taken out of the electric furnace and left to cool to room temperature.

TABLE 1

| | | Example 1 | Example 2 | Example 3 | Example 4 | Example 5 | Example 6 |
|---|---|---|---|---|---|---|---|
| Coating liquid | | | | | | | |
| Matrix raw material | Material | MTES | MTES | MTES | MTES | MTES | MTES |
| | Mass % | 3 | 3 | 3 | 3 | 3 | 3 |
| Pore forming agent | Material | MX-050 | MX-030 | MX-050 | MX-050 | MX-050 | MX-050 |
| | Parts by mass (relative to matrix raw material) | 25.0 | 17.7 | 15.0 | 35.0 | 25.0 | 25.0 |
| Isopropyl alcohol | Mass % | 86.5 | 88.8 | 89.5 | 83.5 | 86.5 | 86.5 |
| 3-methoxy-1-butanol | Mass % | 3 | 3 | 3 | 3 | 3 | 3 |
| Purified water | Mass % | — | — | — | — | | |
| Formation of coating film | | | | | | | |
| Spin coating | Rotation speed (rpm) | 600 | 550 | 600 | 600 | Roll coater | Roll coater |
| | Time (seconds) | 10 | 10 | 10 | 10 | | |
| | Thickness nm | 120 | 110 | 120 | 130 | 150 | 150 |
| Contact angle-increasing film | | | | | | | |
| | Contact angle-increasing agent | Unprovided with contact angle-increasing film | Unprovided with contact angle-increasing film | Unprovided with contact angle-increasing film | Unprovided with contact angle-increasing film | Unprovided with contact angle-increasing film | Tridecafluorooctyl-triethoxysilane |
| | Thickness nm | | | | | | 5 |
| Properties | | | | | | | |
| | Open pores | Not included | Not included | Not included | Not included | 4 pores/$\mu m^2$ | 4 pores/$\mu m^2$ |
| | Surface smoothness of coating film | 1.52 | 0.97 | 1.28 | 1.96 | 4.75 | 4.75 |
| | Transmittance gain (%) | 2.96 | 2.57 | 2.65 | 2.62 | 2.80 | 2.69 |
| | Ease of removal of adhering matter 1 | Good | Excellent | Excellent | Good | Good | Excellent |
| | Ease of removal of adhering matter 2 | — | — | — | — | — | Good |
| | Salt water resistance (%) | 0.01 | 0.06 | 0.05 | 0.12 | 0.03 | 0.03 |

| | | Example 7 | Example 8 | Example 9 | Comparative Example 1 | Comparative Example 2 | Comparative Example 3 |
|---|---|---|---|---|---|---|---|
| Coating liquid | | | | | | | |
| Matrix raw material | Material | MTES | MTES | MTES | TEOS | MTES | MTES |
| | Mass % | 3 | 3 | 3 | 2 | 3 | 3 |
| Pore forming agent | Material | MX-050 | MX-050 | MX-050 | MX-050 | MX-050 | MX-050 |
| | Parts by mass (relative to matrix raw material) | 25.0 | 25.0 | 25.0 | 25.0 | 10.0 | 40.0 |

TABLE 1-continued

| | | | | | | | |
|---|---|---|---|---|---|---|---|
| Isopropyl alcohol | Mass % | 86.5 | 86.5 | 86.5 | 85.0 | 91.0 | 82.0 |
| 3-methoxy-1-butanol | Mass % | 3 | 3 | 3 | 3 | 3 | 3 |
| Purified water | Mass % | | | | 5 | — | — |
| Formation of coating film | | | | | | | |
| Spin coating | Rotation speed (rpm) | Roll coater | Roll coater | 600 | 600 | 600 | 600 |
| | Time (seconds) | | | 10 | 10 | 10 | 10 |
| | Thickness nm | 150 | 150 | 110 | 130 | 110 | 120 |
| Contact angle-increasing film | | | | | | | |
| | Contact angle-increasing agent | MTES | OPTOOL DSX | MTES, $ZrO_2$, $Al_2O_3$ | Unprovided with contact angle-increasing film | Unprovided with contact angle-increasing film | Unprovided with contact angle-increasing film |
| | Thickness nm | 6 | 5 | 6 | | | |
| | Properties | | | | | | |
| | Open pores | 4 pores/$\mu m^2$ | 4 pores/$\mu m^2$ | Not included | 10 pores/$\mu m^2$ or more | Not included | Not included |
| Surface smoothness of coating film | | 4.75 | 4.75 | 1.98 | 2.43 | 0.99 | 2.34 |
| Transmittance gain (%) | | 2.73 | 2.63 | 2.77 | 2.41 | 2.27 | 2.11 |
| Ease of removal of adhering matter 1 | | Excellent | Excellent | Excellent | Poor | Excellent | Good |
| Ease of removal of adhering matter 2 | | Good | Good | Excellent | — | — | — |
| Salt water resistance (%) | | 0.02 | 0.03 | 0.04 | 1.26 | 0.02 | 0.13 |

INDUSTRIAL APPLICABILITY

The coated glass sheet of the present invention allows easy removal of matter adhering thereto and can exhibit superior light transmission properties. The coated glass sheet can therefore be used in various applications such as in vehicle panes, show-windows, and glass sheets for photoelectric conversion devices.

The invention claimed is:

1. A coated glass sheet comprising:
a glass sheet; and
a coating film provided on at least one principal surface of the glass sheet and having a smooth surface,
wherein the coating film comprises: closed pores; and a matrix,
the coating film is substantially free of open pores open at the surface of the coating film,
a transmittance gain is 2.5% or more, the transmittance gain being calculated by subtracting an average transmittance of the glass sheet as determined by applying light having wavelengths of 380 to 1100 nm to the glass sheet in the absence of the coating film on the surface of the glass sheet from an average transmittance of the coated glass sheet as determined by applying light having the wavelengths to the coated glass sheet,
the closed pores, when viewed in a cross-section along a thickness direction of the coating film, include first closed pores that are approximately elliptical isolated pores and second closed pores each formed of two or more approximately elliptical pores connected to each other,
the first closed pores and the approximately elliptical pores forming the second closed pores each have a major axis with a length of 30 to 80 nm and a minor axis with a length of 20 to 30 nm and are arranged so that the major axes extend along the surface of the coating film,
the matrix of the coating film comprises silica as a main component,
the silica is derived from a product of hydrolysis and condensation of a silicon alkoxide, and
the silicon alkoxide consists of a silicon alkoxide having one or two alkyl groups directly bonded to a silicon atom.

2. The coated glass sheet according to claim 1, wherein the coating film has a thickness of 50 to 300 nm and a porosity of 10 to 40%.

3. The coated glass sheet according to claim 2, wherein the coating film has a thickness of 100 to 250 nm.

4. The coated glass sheet according to claim 1, further comprising a contact angle-increasing film provided on the coating film.

5. The coated glass sheet according to claim 1, wherein, when the surface of the coating film is observed, granules having a diameter of 20 to 100 nm are present in the surface of the coating film, and the number of the granules per unit area of the surface of the coating film is 10 to 100 granules/$\mu m^2$.

6. The coated glass sheet according to claim 1, wherein, in the surface of the coating film, a region that is free of openings of the open pores and that is free of granules when the granules are present in the surface has an arithmetic average roughness Ra of 3 nm or less as determined over an evaluation length of 300 nm.

7. The coated glass sheet according to claim 1, wherein the alkyl group is a linear alkyl group having 1 to 5 carbon atoms.

8. The coated glass sheet according to claim 1, wherein the matrix of the coating film further comprises an oxide of at least one element selected from the group consisting of aluminum, titanium, and zirconium.

9. The coated glass sheet according to claim 1, wherein the closed pores and the open pores are derived from particles that are contained as a pore forming agent in a coating liquid for forming the coating film and that are lost by heat treatment at a temperature equal to or higher than a predetermined temperature.

10. The coated glass sheet according to claim 9, wherein the particles are organic polymer particles.

11. The coated glass sheet according to claim 10, wherein the organic polymer particles have an average particle diameter of 10 to 200 nm.

12. The coated glass sheet according to claim 9, wherein the coating liquid further contains a hydrolyzable silicon compound, and
a content of the particles is 12 to 38 parts by mass relative to 100 parts by mass of a product of hydrolysis and condensation of the hydrolyzable silicon compound in the coating liquid.

13. A method for producing the coated glass sheet according to claim 1, comprising:
(i) applying a coating liquid containing a matrix raw material and a pore forming agent onto a principal surface of a glass sheet to form a wet film on the principal surface of the glass sheet;
(ii) drying the wet film; and
(iii) calcining the dried film;
wherein the coating liquid contains a hydrolyzable silicon compound as the matrix raw material,
the hydrolyzable silicon compound is a silicon alkoxide,
the silicon alkoxide consists of a silicon alkoxide having one or two alkyl groups directly bonded to a silicon atom, and
wherein the silicon alkoxide is hydrolyzed and condensed to form the matrix of the coating film.

14. The method according to claim 13, wherein the silicon alkoxide consists of a silicon alkoxide having one or two alkyl groups directly bonded to a silicon atom.

15. The method according to claim 13, wherein the organic group is a linear alkyl group having 1 to 5 carbon atoms.

16. The method according to claim 13, wherein the pore forming agent comprises particles that are lost by heat treatment at a temperature equal to or higher than a predetermined temperature.

17. The method according to claim 16, wherein the particles are organic polymer particles.

18. The method according to claim 17, wherein the organic polymer particles have an average particle diameter of 10 to 200 nm.

19. The method according to claim 13, wherein
the coating liquid contains a hydrolyzable silicon compound as the matrix raw material and contains, as the pore forming agent, particles that are lost by heat treatment at a temperature equal to or higher than a predetermined temperature, and
a content of the particles is 12 to 38 parts by mass relative to 100 parts by mass of a product of hydrolysis and condensation of the hydrolyzable silicon compound in the coating liquid.

* * * * *